United States Patent [19]

Xu

[11] Patent Number: 4,520,268

[45] Date of Patent: May 28, 1985

[54] METHOD AND APPARATUS FOR INTRODUCING NORMALLY SOLID MATERIALS INTO SUBSTRATE SURFACES

[75] Inventor: Zhong Xu, Columbia, S.C.

[73] Assignees: Pauline Y. Lau; Roland L. Lau, both of Columbia, S.C.

[21] Appl. No.: 498,313

[22] Filed: May 26, 1983

[51] Int. Cl.$^3$ .............................................. G21K 5/00
[52] U.S. Cl. .................................. 250/492.1; 427/39; 204/192 N
[58] Field of Search ...................... 250/492.1; 204/298, 204/192 R, 164, 192 N; 427/39; 118/634

[56] References Cited

U.S. PATENT DOCUMENTS

| | | | |
|---|---|---|---|
| 1,162,149 | 11/1915 | Eckhardt . | |
| 3,189,535 | 6/1965 | Webb | 204/298 |
| 3,361,659 | 1/1968 | Bertelsen | 204/298 |
| 3,475,307 | 10/1969 | Knox et al. | 204/168 |
| 3,516,855 | 6/1970 | Goll et al. | 117/212 |
| 3,630,871 | 12/1971 | Wagner | 204/192 |
| 3,654,110 | 4/1972 | Kraus | 204/192 |
| 3,816,288 | 6/1974 | Lubicz | 204/164 |
| 3,908,183 | 9/1975 | Ennis | 204/298 |
| 3,944,873 | 3/1976 | Franks et al. | 315/111.8 |
| 3,953,619 | 4/1976 | Matsubara | 204/298 |
| 4,116,191 | 9/1978 | Zega | 204/298 |
| 4,224,897 | 9/1980 | Dugdale | 204/298 |
| 4,236,994 | 12/1980 | Dugdale | 204/298 |
| 4,243,506 | 1/1981 | Ikeda et al. | 204/298 |
| 4,288,306 | 9/1981 | Kieferle et al. | 204/298 |
| 4,325,776 | 4/1982 | Menzel | 204/298 |

OTHER PUBLICATIONS

"Production Ionitriding", Bernd Edenhofer, *Metal Progress*, Mar. 1976, pp. 181-185.

"Using the Ionitriding Process to Meet Your Material Improvement Needs", Lindbert Heat Treating Co., *Process Data Sheet No. 11*, Though date of sheet is not known, copy was in counsel's hands as early as May, 1983.

"Nitriding, Sintering and Brazing by Glow Discharge", Claude K. Jones and Stuart W. Martin, *Metal Progress*, Feb. 1964, pp. 197-201.

*Primary Examiner*—Bruce C. Anderson
*Attorney, Agent, or Firm*—Roylance, Abrams, Berdo & Goodman

[57] ABSTRACT

Method and apparatus for introducing normally solid metals or metalloids into electrically conductive substrates. The invention is particularly useful in surface alloying of metal substrates and makes it possible to introduce such metals as tungsten into ferrous metal substrates to diffused depths of 100 microns and more without undue expense. The metal or metalloid to be introduced is maintained at an elevated temperature below the boiling point but equal to at least 40% of the melting point, the surface portion of the substrate is maintained at an elevated temperature below the deformation point, and a double glow discharge is employed under controlled conditions to transfer the metal or metalloid to the substrate.

28 Claims, 7 Drawing Figures

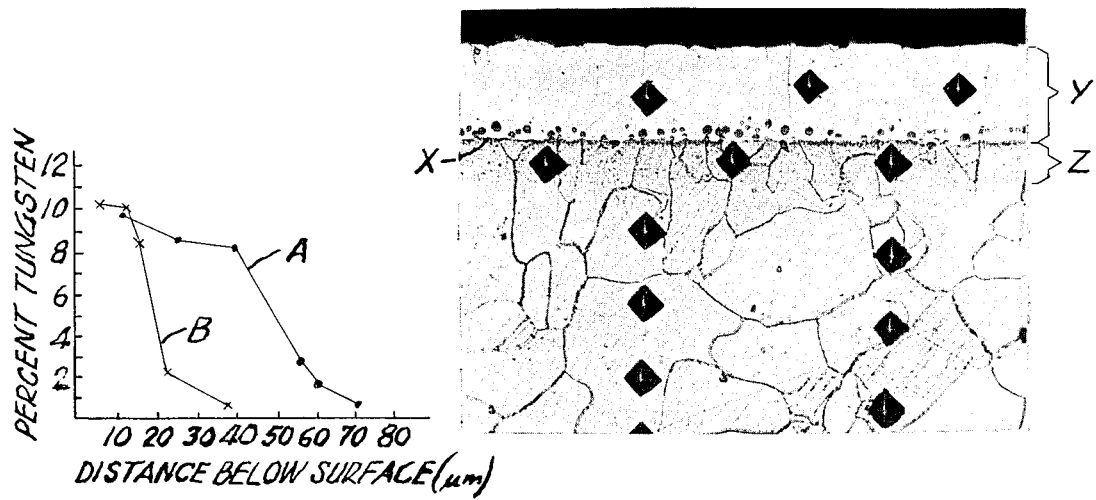
Fig. 2
Fig. 3
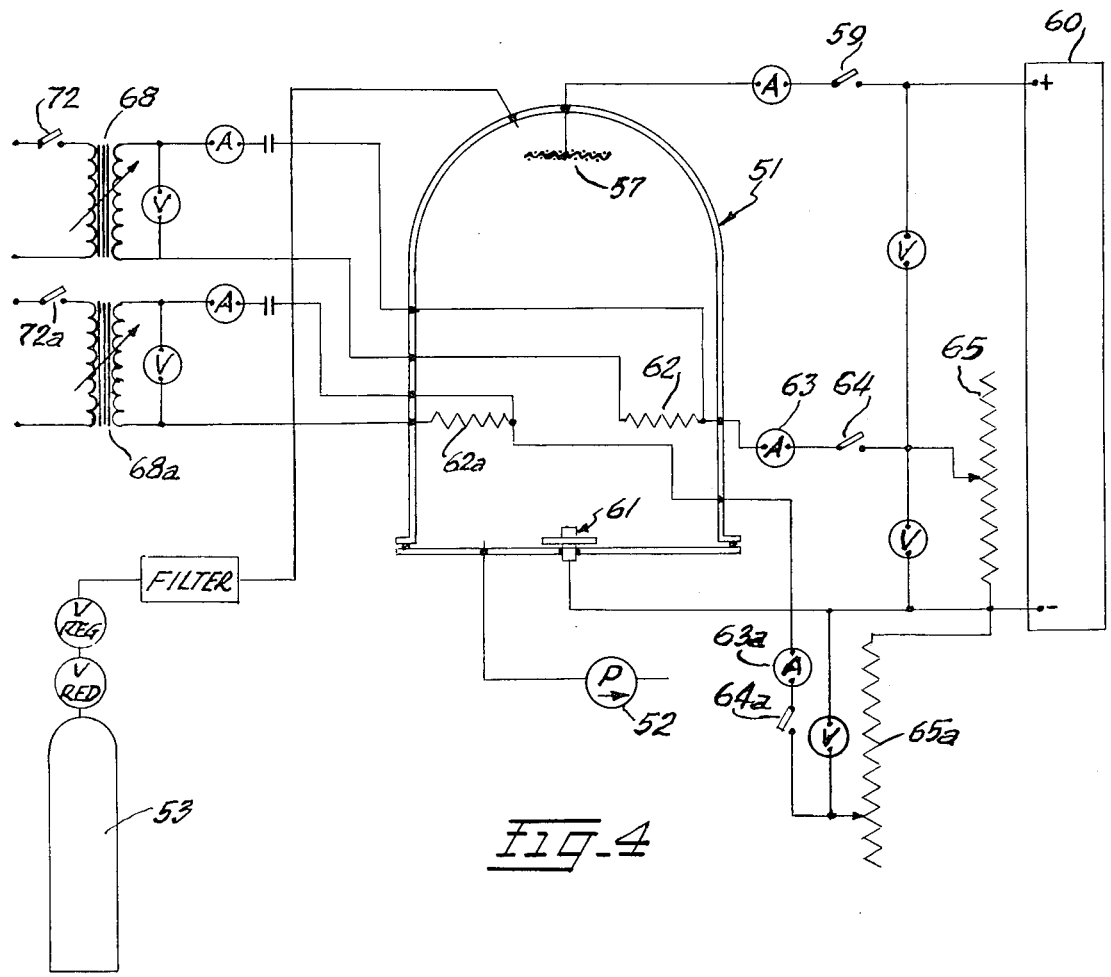
Fig. 4

METHOD AND APPARATUS FOR INTRODUCING NORMALLY SOLID MATERIALS INTO SUBSTRATE SURFACES

This invention relates generally to the introduction of normally solid metals and metalloids into surfaces of electrically conductive substrates. Advantageously, the invention is useful for surface alloying of metal substrates. Both a method and an apparatus are provided for accomplishing permeation of electrically conductive surfaces by ions of normally solid materials.

BACKGROUND OF THE INVENTION

It has long been commercially desirable to modify electrically conductive substrates, and particularly metal substrates, by introduction of normally solid metals and metalloids into a surface portion of the substrate, and this has heretofore been accomplished by, e.g., dipping procedures, by surrounding the substrate with a powder of the metal to be introduced and then heating in a furnace, and by other methods which are cumbersome, offer little real control of the introduction of the metal or metalloid, and are not practical when expensive metals such as tungsten are to be introduced. Introduction of metals into substrate surfaces has also been accomplished by use of the ion beam and the laser, but such approaches require expensive apparatus and very high power and in all events are limited to treatment of small substrate areas, as in the manufacture of microcircuits. Disadvantages of such prior-art methods have been overcome when the material to be introduced into the substrate is normally gaseous, as when nitrogen is to be introduced. Thus, ion nitriding has been accomplished when large substrate surface areas are to be treated, as described for example in "Nitriding, Sintering and Brazing by Glow Discharge", Claude K. Jones et al, Metal Progress, February, 1964. But there has been a continuing need for a method and apparatus which would make it possible to introduce metals and metalloids economically into a surface of the conductive substrate, especially when the substrate is of metal, or has a large surface area to be treated, or when the substrate surface to be treated is curved or irregular rather than flat, or when the metal to be introduced into the substrate has a high melting point or is expensive.

OBJECTS OF THE INVENTION

A general object of the invention is to devise an improved method and apparatus for introducing at least one normally solid metal or metalloid into an electrically conductive substrate without requiring use of costly high voltage power sources or high vacuum conditions.

Another object is to provide such a method and apparatus capable of introducing ions of metals and metalloids into relatively large substrate surfaces.

Another object is to provide such a method and apparatus capable of treating substrate surfaces which are curved, such as the inner surface of a reactor vessel.

A further object is to provide such a method and apparatus by which the amount of material introduced and the depth of introduction can be controlled.

Yet another object is to devise such a process which can be carried out in conventional equipment such as, e.g., a modified conventional ion nitriding furnace.

A still further object is to provde such a method capable of introducing a plurality of normally solid materials into a substrate surface in one operation.

Another object is to provide an economical method and apparatus for surface alloying of a metal substrate in such fashion that nitriding of the surface-alloyed part will provide greater improvement in hardness.

SUMMARY OF THE INVENTION

According to method embodiments of the invention, a closed chamber is provided in which the atmosphere and pressure can be controlled and which includes an anode; the substrate is positioned as a cathode with a surface exposed to the interior of the chamber and spaced from the anode; a source electrode comprising a body of the metal or metalloid to be introduced into the substrate, that body being exposed within the chamber in a location spaced from the anode and the substrate; the chamber is evacuated and an atmosphere of inert gas at a pressure not exceeding 10 torr is established therein; direct current potential differences are established between the anode and the cathode and between the anode and the source electrode to cause a double glow discharge with one glow discharge occurring between the anode and cathode and the other between the anode and the source electrode, and the double glow discharge is maintained for at least 15 minutes; the surface portion of the substrate is maintained at an elevated temperature not exceeding the deformation point; and the body of material to be introduced into the substrate is maintained at a temperature equal to at least 40% of the melting point but below the boiling point of the material. Apparatus embodiments are characterized by means for establishing and maintaining the double glow discharge and means external to the chamber for heating the body of material to be introduced into the substrate.

IDENTIFICATION OF THE DRAWINGS

FIG. 2 is a graph of the concentration of tungsten at various depths in the substrate when the method is carried out according to one method embodiment;

FIG. 3 is a photomicrograph of a ferrous substrate into which tungsten has been introduced according to the method;

FIG. 4 is a schematic diagram similar to FIG. 1 of apparatus adapted to simultaneous introduction of two metals into a single substrate;

DETAILED DESCRIPTION OF THE INVENTION

The Method In General

Figure 1:
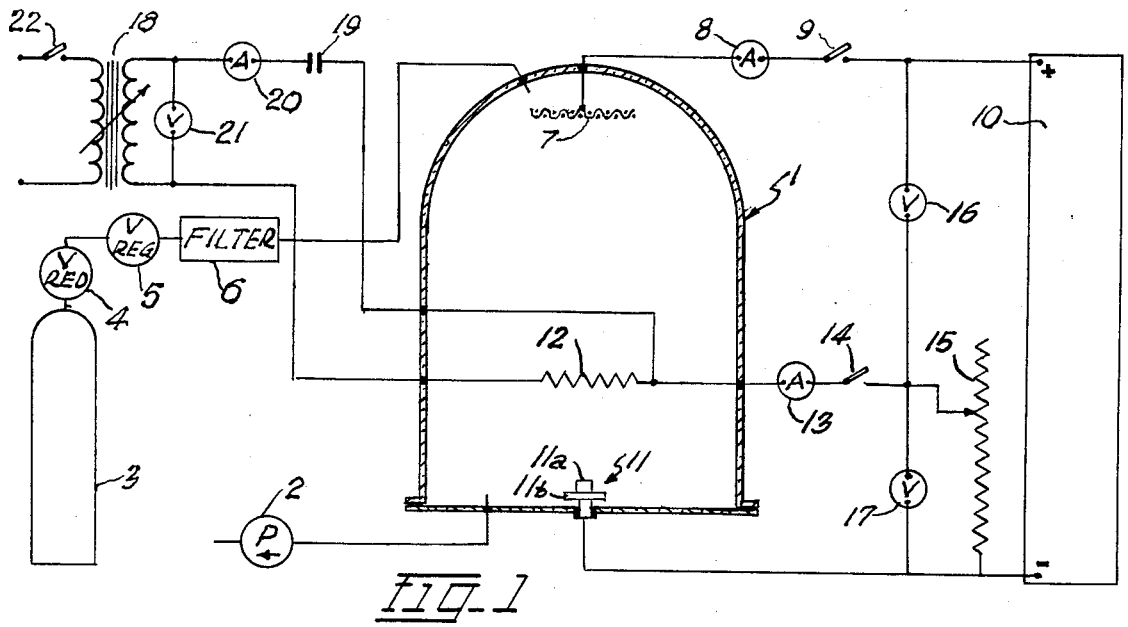
FIG. 1 is a schematic diagram of a laboratory scale apparatus according to one apparatus embodiment of the invention.

Broadly considered, method embodiments of the invention comprise providing a sealed chamber in which the atmosphere and pressure can be controlled. The chamber is provided with an anode and the electrically conductive substrate, advantageously having first been preliminarily cleaned, is arranged as the cathode with at least that surface which is to be treated exposed to the interior of the chamber. Thus, the substrate can be wholly within the chamber or can constitute a portion of the chamber wall. A body of the metal or metalloid to be introduced in the substrate is arranged within the chamber as an intermediate or source electrode or as a part of that electrode. The chamber is evacuated to a pressure below 0.01 torr and then purged and charged with an inert gas, advantageously argon or helium, to establish in the chamber an inert atmosphere at a pressure of 0.1–10 torr. At the outset, the inert gas pressure is kept low, in the range of 0.1–1 torr, to minimize the possibility of damage to the substrate surface by arc discharges resulting if the substrate surface carries some residual foreign material. After the substrate surface is clean, additional inert gas is introduced into the chamber, raising the pressure of the atmosphere, advantageously to at least 1 torr. A direct current potential difference is established between the anode and the cathode at least equal to the glow discharge inception voltage for the particular atmosphere and pressure, so that a glow discharge is established between the anode and the cathode, and this glow discharge is maintained. For substrates with relatively small surface areas, the glow discharge will promptly affect the entire surface area. For relatively large substrates with a relatively complex surface, the glow discharge will occur initially at a portion of the substrate surface, then expand to cover the entire surface. In all cases, the glow discharge causes the substrate to be bombarded with positive ions of the inert atmosphere and such ion bombardment heats the surface portion of the substrate to an elevated temperature. Another effect of the glow discharge is to clean the exposed surface of the substrate.

The temperature to which the surface portion of the substrate is heated by the ion bombardment resulting from the glow discharge depends upon the composition of the substrate, the depth of ion permeation desired, the time allowable for the treatment, and other variables. For all substrate materials, the temperature must not exceed the deformation point. For metal substrates, the temperature must be at least 300° C. if metal or metalloid ion permeation is to be achieved within a reasonable time. For non-metallic substrates, as with electrically conductive polymeric substrates, the temperature should be at least 100° C.

At the outset, or after arc discharge bursts in the glow are no longer observed, the direct current voltage is increased to drive the glow discharge into the abnormal range and a second direct current potential difference of the same polarity as the first is established between the anode and the source electrode which is lower than that across the anode-cathode gap but at least equal to the inception voltage for the anode-source system. With both potential differences established, and with glow discharge continuing in the abnormal range, the result is a double glow discharge, one glow discharge occurring between the anode and the source electrode, the second occurring between the anode and the cathode. An alternating current voltage is also established across the source electrode to cause alternating current flow through the body of metal or metalloid to be introduced, so that the metal or metalloid to be introduced is heated by both ion bombardment and resistance heating to a temperature which is equal to at least 40% of the melting point but below the boiling point of the metal or metalloid at the pressure of the inert atmosphere.

The glow discharge is allowed to persist for at least one minute, depending upon the nature and size of the substrate, the composition and pressure of the inert atmosphere, and the electrode spacing, before the main gap potential difference is increased to establish the abnormal range glow discharge mode. The inception voltage is typically on the order of 250–450 V, and after inception of the glow discharge the potential difference can simply be increased until the double glow is observed, and can then be further increased. A potential difference of 300–1000 V. is particularly advantageous. The alternating current voltage for resistance heating of the metal or metalloid to be introduced in the substrate depends upon the particular metal or metalloid, the physical form of the source electrode (e.g., whether the electrode consists of a wire of the metal or metalloid to be introduced or employs a support for the metal or metalloid), and upon the temperature to be achieved. Thus, when the source electrode consists of a self-supporting helical tungsten wire of relatively small diameter, the alternating current voltage can be 1–20 V typically at 10–50 amps to bring the tungsten wire to the white hot temperature. Advantageously, the resistance heating is continued throughout the processing period, i.e., throughout operation in the double glow discharge mode. The direct current voltage between the source electrode and cathode is advantageously less than the inception voltage for glow discharge under the conditions of the apparatus and inert atmosphere used. The time for which the double glow discharge conditions are maintained depends upon the depth to which the metal or metalloid ions are to permeate the substrate, the nature of the metal or metalloid to be introduced and the temperature to which that metal or metalloid is heated, and the nature, temperature and size of the substrate. For a small substrate and shallow penetration by the introduced metal, the time can be as short as 15 minutes. For large substrates and deep penetration, the time can be 10 hours or longer, the upper limit being determined by economics.

The double glow discharge can be observed as one glow adjacent the cathode and a second glow adjacent the source electrode, the length of the areas of the two glows being small as compared to the electrode spacing. The areas in which the glows are seen are areas of high potential difference. The glow discharge at the cathode causes the substrate to be bombarded with positive ions of the inert gas and of the metal or metalloid and thereby heats the substrate. The glow discharge at the source electrode causes the metal or metalloid at that electrode—the material to be introduced into the substrate—also to be bombarded by positive ions of the inert gas, so that material is also heated, aiding the resistance heating to bring the metal or metalloid to the desired elevated temperature. With the material to be introduced now at its elevated temperature, bombardment of that metal or metalloid by positive ions of the inert gas causes positive ions of the metal or metalloid to be ejected from the source electrode. Under the double glow discharge conditions, positive ions so ejected from the source electrode are carried to the substrate, which has the negative charge of a cathode. The difference in charge between the positive ions and the substrate results in vigorous bombardment of the heated substrate surface by the positive ions of metal or metalloid, with the result that the ions penetrate the surface. Though details of the phenomenon are not yet completely understood, it is believed that, upon penetrating the substrate surface, the positive ions acquire from electrical current flow the electrons which the positive ions lack, so that the ions are promptly converted to atoms. Initial penetration under the energy of the bombardment is shallow, likely only to a depth equal only to several times the dimension of the atom involved. However, continuation of the double glow discharge and maintenance of the elevated temperatures of the source electrode and the substrate surface causes positive ions to be supplied to the substrate continuously and, with the substrate at its elevated temperature, the introduced atoms diffuse throughout the substrate beneath the initial layer, to a depth as much as 100 microns or more, inspection by metallography and analysis by electron probe showing a concentration gradient, the concentration at the surface being higher and that at the limit of permeation being lower. Concentrations of the metal or metalloid in excess of 20% of the weight of that portion of the substrate occupied by the introduced metal or metalloid have been achieved.

By employing two or more source electrodes, each carrying a different material to be introduced, the method can be carried out to introduce two or more different metals or metalloids simultaneously into the same substrate. In that case, once the main gap potential difference has been raised adequately to cause the glow discharge to be in the abnormal range, glow discharges occur between the anode and cathode and between the anode and each source electrode.

While the invention can be employed to introduce ions of at least one normally solid metal or metalloid in any electrically conductive substrate capable of being penetrated by high velocity ions under the multiple glow discharge conditions, the invention is especially advantageous for surface alloying of metal substrates, and the substrate can be any metal, pure or alloyed, with a melting point high enough that the substrate retains its solid condition at the temperature to which the substrate is heated by glow discharge. For commercial purposes, use of the method and apparatus to accomplish surface alloying of ferrous metal substrates is particularly important. Choice of the metal or metalloid to be introduced is limited only to those metals and metalloids which are normally solid. Particularly advantageous materials to be introduced into the metal substrates are aluminum, chromium, cobalt, copper, germanium, gold, iron, lead, manganese molybdenum, nickel, niobium, platinum, silicon, tantalum, technitium, titanium, tungsten, uranium, vanadium, zirconium, and the lanthanides.

The method is differentiated from the prior art by the ability of the method economically to introduce into the surface of an electrically conductive substrate one or more metals or metalloids without limitation as to the substrate surface area to be treated. A particularly important distinguishing characteristic of the method is its ability to introduce into substrates even metals and metalloids having high melting points and to do so without requiring large and expensive energy sources and extreme process conditions. In addition, the method has the advantage of good controllability. Thus, the depth of permeation of the metal or metalloids into the substrate can be controlled by controlling the temperature of the substrate and the energy and duration of the double glow discharge, while the amount of material introduced can be controlled by controlling the temperature of the source electrode, the energy of the glow discharge and the time period of treatment. Surprisingly, though it is believed that the glow discharge ejects not only positive ions but also uncharged particles from the source electrode, the surface of the substrate being treated is alloyed, without significant surface coating of the type which is seen if the substrate is not at an elevated temperature. A further advantage of the method is its ability to introduce metals or metalloids reasonably uniformly into substrate surfaces which are not flat. Thus, the method is operative to alloy the spherical surface of, e.g., a male ball joint member or the concave inner surface of a container.

Since bombardment by ions of the inert gas heats the substrate and aids in heating the metal or metalloid to be introduced into the substrate, and such ion bombardment is responsible for ejecting ions from the source electrode, it is particularly advantageous to have in the chamber an inert gas pressure in excess of 1 torr when the double glow discharge commences and throughout operation in the double glow discharge mode. Accordingly, best embodiments of the method commence with low inert gas pressure, in the range of 0.1-1 torr, for the single glow discharge mode and then increase the inert gas pressure to 1-10 torr before the voltage is increased to establish the double glow discharge, pressures of 3-7 torr being particularly advantageous.

Other embodiments of the method offer special advantages when the substrate is of metal which is to be subjected to ion treatments such as nitriding, carburizing, sulfuration, boronization and nitrocarburizing. In such embodiments, the method is carried out as above described to introduce into the surface portion of the metal substrates the amounts of a metal or metalloids which will render the substrate more receptive to the respective ion treatment, and, using the same apparatus with appropriate changes of atmosphere, ion nitriding, ion carburizing, ion sulfuration, ion boronization or ion nitrocarburizing is then carried out. Such embodiments are particularly advantageous because they make it unnecessary to have the desired alloy elements throughout the mass of the substrate. Thus, the method makes it commercially feasible to use expensive tungsten in a piece to be ion nitrided, since the tungsten is limited to the surface portion of the piece.

Though embodiments of the invention described above cause little if any surface plating or coating, since the substrate is maintained at an elevated temperature to achieve penetration of the substrate surface by the metal or metalloid ions being introduced, the method can be modified to provide plating after the metal or metalloid ions have been introduced into the substrate. Thus, the method can be carried out as described above to introduce the desired ions into the surface portion of the substrate, the substrate can then be cooled, and plating with the same or a different metal or metalloid can then be accomplished, using the same apparatus, an appropriate atmosphere and appropriate vacuum, the plating metal or metalloid source or sources being at the source electrode or electrodes. Further, by progressively cooling the substrate while otherwise carrying out the method as first described, the ions introduced into the substrate can be progressively concentrated near but below the surface, since the substrate becomes more resistant to ion permeation as the temperature of the surface portion of the substrate decreases. Then, if desired, ion plating with the same or a different metal or metalloid can be accomplished, and the plated film so formed will be especially adherent to the substrate.

The Apparatus of FIG. 1

Figure 1A:
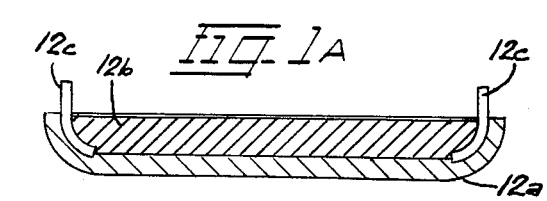
FIG. 1A is an enlarged cross-sectional view of an alternative form of source electrode for use in the apparatus.

FIG. 1 illustrates a laboratory scale apparatus in accordance with one apparatus embodiment. The apparatus comprises a sealed chamber 1, typically a conventional bell jar, equipped for evacuation by vacuum pump 2 and for introduction of an inert gas from pressure tank 3 via reducing valve 4, control valve 5 and filter 6. Within the bell jar in a location adjacent the top thereof is an anode 7 electrically connected via ammeter 8 and switch 9 to the positive terminal of an adjustable direct current power source 10. Cathode 11 is located within the bell jar adjacent the bottom thereof and comprises the electrically conductive substrate, such as cylindrical metal piece 11a and retainer 11b, the cathode being connected directly to the negative terminal of power source 10. A source electrode 12 is provided within the bell jar between the anode and cathode, comprises the metal to be introduced into the substrate, and is connected via ammeter 13 and switch 14 to the adjustable contact of a rheostat 15 and, via the rheostat, to the negative terminal of power source 10. When a high melting point metal such as tungsten is to be introduced, source electrode 12 can simply be a helix of wire formed of that metal. When a metal having a relatively low melting point is to be introduced, source electrode 12 can comprise a boat or other support 12a, FIG. 1A, formed of a high melting point metal and supporting a body 12b of the low melting point metal to be introduced into the substrate, terminals 12c being carried by the ends of the boat and also in electrical contact with body 12b, so that the combination can be connected as the source electrode and to the source of heating current. A voltmeter 16 is connected across the anode/source electrode gap and a voltmeter 17 is connected across the source electrode/cathode gap, as shown.

Source electrode 12 is also connected to an alternating current source for resistive heating of the metal to be implanted. Thus, as shown in FIG. 1, electrode 12 can be connected across the secondary winding of a variable transformer 18 via a blocking capacitor 19, and an ammeter 20, a voltmeter 21 being connected across the secondary winding in parallel with the source electrode. Initiation of alternating current flow for resistance heating of the metal to be introduced is accomplished by closing switch 22.

Bell jar 1 can be transparent and, if not transparent, is provided with a sight window or windows (not shown) allowing observation of the source electrode and the cathode, a conventional optical pyrometer or a thermoelectric thermometer (not shown) being employed to determine temperatures of the substrate and the metal to be introduced. A conventional manometer (not shown) is employed to monitor pressures within the bell jar.

Practicing The Method With The Apparatus Of FIG. 1

To employ the apparatus of FIG. 1 in accordance with method embodiments of the invention, the metal or metalloid to be introduced is placed in the bell jar and connected as the source electrode, and the substrate, having first been cleaned preliminarily, as with ethanol, is placed in the bell jar and connected as the cathode. With the bell jar sealed, vacuum pump 2 is operated to evacuate the bell jar to a pressure of 0.01 torr or less and the bell jar is then purged and charged with an inert gas from tank 3 to establish in the bell jar an inert gas atmosphere at a pressure of 0.1-10 torr. Power source 10 is then activated and switch 9 closed, the power source being adjusted to establish a potential difference between anode 7 and cathode 11 at least equal to the glow discharge inception voltage for the particular atmosphere and pressure. A glow discharge in the normal range results between the anode and cathode, i.e., a glow discharge of such nature that an increase in voltage from the source increases the current without increasing the potential difference across the gap between the anode and cathode. Though inception voltages for inert gas atmospheres at specific pressures are known, this single glow discharge can be established simply by increasing the voltage from source 10 until inception of the glow discharge is observed visually. The single glow discharge can be allowed to persist for one minute to one hour to assure that bombardment of the substrate by ions of the inert gas fully cleans the substrate surface, cessation of observable arc discharges in the chamber indicating that the substrate is completely clean. Ion bombardment resulting from the single glow discharge in the abnormal range, i.e., that range in which an increase in source voltage results in an increase in current proportional to the increase in potential difference across the gap between the anode and cathode, heats the substrate to the desired elevated temperatures of from 100° C. to a point just below the deformation point, depending upon the nature of the substrate, or can be relied upon to accomplish only part of that heating step.

At a time which can be immediately after inception of the single glow discharge or subsequent thereto, as after significant arc discharge bursts are no longer observed, the direct current voltage from source 10 is increased to provide a potential difference across the main anode-cathode gap in the range of 300-1000 V to drive the glow discharge into the abnormal range. With switch 14 closed, a potential difference is established between anode 7 and source electrode 12 which is of the same polarity as that across the anode-cathode gap, is greater than the glow discharge inception voltage and can be adjusted by adjusting rheostat 15. So long as the abnormal range glow discharge conditions persist, the result is a double glow discharge, one glow discharge occurring between the anode and the cathode with the observable glow near the cathode, another between the anode and the source electrode with the observable glow near the source electrode. The double blow discharge mode of operation results in the metal or metalloid to be introduced, carried by the source electrode, being bombarded by ions of the inert gas, such bombardment also continuing at the substrate.

Switch 22 is closed, advantageously after the single flow discharge has heated the substrate to the desired temperature, causing alternating current flow through the metal or metalloid to be introduced, so that the metal or metalloid to be introduced is resistively heated to the desired elevated temperature. With the source electrode resistively heated and with the double glow discharge continuing, the metal or metalloid to be introduced is continuously violently bombarded by ions of the inert gas and, since that metal or metalloid is now at an elevated temperature, such bombardment is effective to eject from the metal or metalloid positive ions of the metal and the ejected ions travel rapidly toward the negatively charged substrate and are driven into the heated exposed surface of the substrate as a result of the difference in charge. Such introduction of the metal or metalloid ions into the substrate does not occur without high temperatures of the source electrode and substrate and a double glow discharge.

The following examples illustrate the method as practiced with the apparatus of FIG. 1.

EXAMPLE 1

Apparatus as diagrammatically illustrated in FIG. 1 was employed to introduce tungsten into a carbon steel #1010 substrate. The vacuum chamber was 30 cm in diameter and 40 cm in height. The anode was a square piece of carbon steel mesh 10 cm on each side. The cathode consisted of the substrate, a carbon steel cylinder 1.5 cm long and 1.2 cm in diameter and a volume of 1.7 cc arranged with the cylinder coaxial with the vertical axis of the vacuum chamber so that one flat end face was directed upwardly toward the anode. The source electrode consisted of pure tungsten wire of 0.6 mm diameter in the form of a helix disposed as shown in FIG. 1. The distance from the anode to the source electrode was 75 mm and the distance from the source electrode to the end face of the carbon steel cylinder was 25 mm. The carbon steel cylinder was preliminarily cleaned with ethanol before being installed as the cathode.

The chamber was evacuated to 0.01 torr, then purged with argon and filled with argon to a pressure of 0.1 torr. The direct current power source was activated to establish a potential difference across the anode/cathode gap and the power source was adjusted to increase that potential difference until a single glow discharge (normal range mode) was observed. The potential difference was held at that level for ten minutes, cessation of observable arc discharge bursts within that time period indicating that the exposed surface of the carbon steel cylinder was clean. Additional argon was then introduced into the chamber to raise the pressure to 4 torr, and a pressure of 4–7 torr was maintained thereafter. The power source was then further adjusted to bring the anode/cathode voltage gradually to 750 V, and the single glow discharge was allowed to persist, now in the abnormal range, until the temperature of the carbon steel substrate reached 1000° C. The source electrode was then connected to both the direct current source, to establish the double glow discharge, and to the alternating current source, to commence resistance heating of the tungsten source electrode. The potential difference between the anode and cathode was maintained at 750 V and that between the anode and source electrode at 570 V. Resistance heating raised the temperature of the tungsten source electrode to approximately 2000° C. and the temperature of the carbon steel substrate remained at approximately 1000° C. Operation with both the double glow discharge and the resistance heating was continued for five hours. The two power sources were than disconnected and the carbon steel piece allowed to cool within the sealed chamber before removal for analysis.

Electron probe analysis of a sample of the substrate determined that the maximum depth of penetration of the carbon steel substrate by the tungsten was 116 microns, with the tungsten content by weight at a depth of 10 microns from the surface being 9.76%. The graph of FIG. 2 shows typical distribution of tungsten introduced in a carbon steel substrate according to the method, curve A showing the results of FIG. 1, curve B showing the results of a similar run when the substrate temperature was 900° C. rather than 1000° C.

FIG. 3 is a photomicrograph at an enlargement of 250× of a surface portion of the substrate after treatment according to FIG. 1. The line seem at X is the phase separation plane between portion Y, of higher tungsten content, and portion Z, of lower tungsten content. It will be seen that the maximum penetration limit is at the bottom (as viewed) of portion Z.

EXAMPLE 2

The procedure of Example 1 was repeated, using the same apparatus. The cathode again consisted of the substrate, a carbon steel #1010 cylinder of the same dimensions as in Example 1. The source electrode consisted of a spiral wire of pure tungsten, the wire diameter being 0.6 mm. Voltages were the same as in Example 1. Temperature of the carbon steel substrate was maintained at 900° C. and the tungsten source electrode was maintained at approximately 1600° C. The time period for double glow discharge operation was again three hours.

Electron probe analysis showed a maximum depth of penetration of tungsten into the substrate of 40 microns. Tungsten content by weight at 5 microns from the surface was 10.14%.

EXAMPLE 3

Example 2 was repeated, using the same apparatus, with the substrate again being carbon steel #1010 and the source electrode again being tungsten wire in the form of a helix. The anode-to-cathode potential difference was kept at approximately 800 V throughout operation with the double glow discharge and the potential difference between the anode and source electrode was kept in the range of 550–600 V. The double glow discharge was maintained for three hours. The surface portion of the substrate was at 1000° C. and the temperature of the tungsten wire was approximately 1800° C.

Electron probe analysis showed that tungsten had penetrated to a depth of 80 microns below the surface of the substrate and that the weight content of tungsten at a depth of 5 microns was 9.5%.

EXAMPLE 4

Example 2 was repeated except that the substrate was carbon steel #1045, the source electrode consisted of molybdenum wire in the form of a helix, the anode-to-cathode potential difference was maintained at 850–900 V throughout the double glow discharge mode, the anode-to-source electrode potential difference was maintained at 600–500 V. The time period of operation with double glow discharge was three hours, with the substrate at approximately 1000° C. and the source electrode at approximately 1400° C.

Electron probe analysis showed a molybdenum penetration depth of 60 microns and the weight content of molybdenum at 15 microns from the surface of the carbon steel substrate was 5%.

EXAMPLE 5

The procedure of Example 1 was again repeated, using the same apparatus and with the cathode again consisting of a cylinder of carbon steel #1010 of the same dimensions as in Example 1. The source electrode included a boat in the form of a stamped piece of molybdenum sheet, the boat being 15 mm long, 4 mm wide and 3 mm deep. The material to be introduced into the substrate consisted of a uniform mixture of 0.2 g copper powder and 0.2 g silica powder, the mixture being contained in the boat and the combination of the boat and powder mixture being connected electrically as the source electrode to the alternating current source and the direct current source. The anode/cathode direct current potential difference was maintained at approximately 750 V throughout operation in the double glow discharge mode and the anode/source electrode potential difference was maintained at 500–550 V. The temperature of the powder mixture in the boat was maintained at 900°–1000° C. with alternating current heating. The surface portion of the substrate was maintained at 1000° C. The time period of operation in the double glow discharge mode was 3 hours.

Analysis by electron probe showed the maximum penetration depth by copper and silicon into the substrate to be 85 microns, with the weight content of silicon at a depth of 40 microns being 4% and the weight content of copper at 40 microns being 1%.

EXAMPLE 6

To provide an article with excellent surface hardness without requiring that expensive alloying elements be present throughout the entire body of the article, the procedure of Example 1 can be repeated to effect surface alloying of the carbon steel substrate with tungsten. Then, after the surface-alloyed article has been cooled to 350°–650° C., the inert gas atmosphere in the chamber is replaced by ammonia or a mixture of nitrogen and hydrogen to bring the pressure in the chamber to 1–10 torr, depending upon the extent of nitriding of the surface-alloyed article desired. A direct current potential difference is then established between the anode and the cathode adequate to establish a single glow discharge in the abnormal range and the single glow discharge is maintained in the abnormal range for from 10 minutes to 12 hours, depending upon the temperature of the substrate and the depth to which surface alloying has been achieved by the double glow discharge procedure of Example 1, while maintaining the substrate at 350°–650° C. Thus, if surface alloying has caused a tungsten penetration of 100 microns into the carbon steel, the substrate is typically maintained at 500° C. and the single glow discharge for ion nitriding is maintained for about six hours.

Simultaneous Introduction Of More Than One Metal Or metalloid

FIG. 4 illustrates schematically an apparatus for simultaneous introduction of two different metals or metalloids into a surface of a single substrate according to the invention. Vacuum chamber 51, anode 57, cathode 61, direct current power source 60 and electrical connections of the anode and cathode remain as described with reference to FIG. 1. Pump 52 is provided for evacuation of the chamber, and inert gas is supplied from pressure tank 53 as described with reference to FIG. 1. In this embodiment, two source electrodes 62 and 62a are provided, both being located within the chamber and between the anode and cathode, as shown. One terminal of source electrode 62 is connected to the negative terminal of power source 60 via ammeter 63, switch 65 and rheostat 65. Similarly, one terminal of electrode 62a is connected to the negative terminal of power source 60 via ammeter 63a, switch 64a and rheostat 65a. Electrode 62 is connected across the secondary winding of variable transformer 68, so that alternating current flow through electrode 62 can be established by closing switch 72. Electrode 62a is connected across the secondary winding of variable transformer 68a, so that alternating current flow through electrode 62a for resistance heating of that electrode can be established by closing switch 72a.

When a single glow discharge between the anode and cathode has been established by closing switch 59 and adjusting the direct current potential difference between the anode and cathode of the inception voltage, switchs 64 and 64a are closed to connect both electrodes 62 and 62a to power source 60 and, with the potential difference across the anode/cathode gap adequate to establish operation in the abnormal range, multiple glow discharges result. Thus, a glow discharge between the anode and cathode 61, a glow discharge between the anode and source electrode 62 and a glow discharge between the anode and source electrode 62a, are established. Source electrode 62 carries one metal or metalloid, e.g., tungsten, to be introduced into the cathode substrate. Electrode 62a carries a second, different metal or metalloid, e.g., molybdenum, to be introduced in the cathode substrate. Both materials to be introduced are resistance heated, by controlled alternating current flow, to the white-hot temperature. As described with reference to the method as carried out with the single-source electrode apparatus of FIG. 1, multiple glow discharge operation, with the source electrode at elevated temperature, results in ejection of metal ions from the source electrodes and, with the single cathode substrate being violently bombarded by ions of both metals or metalloids, introduction of both materials below the exposed surface of the substrate. Depending upon the particular metals or metalloids to be introduced, the positions and potentials of the two source electrodes relative to the anode and cathode can be the same or different. Though FIG. 4 illustrates the apparatus with two source electrodes, more than two source electrodes can be employed in the same manner just described.

Introduction Of Metal Or Metalloid In Curved Substrate Surfaces

Figure 5:
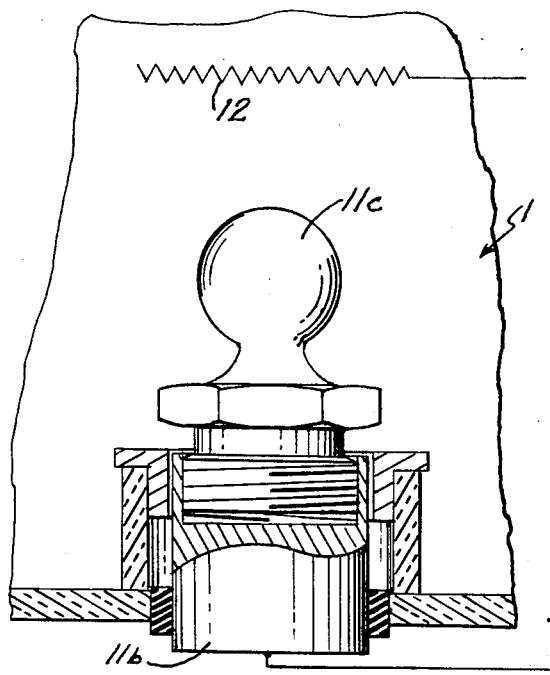
FIG. 5 is a fragmentary semidiagrammatic illustration of a portion of the apparatus of FIG. 1 adapted for treatment of the spherical surface presented by a ball joint member.

While, with flat substrate surfaces, a particular advantage of the method is its ability to treat large surface areas, another advantage of importance is ability of the method to implant metals in curved surfaces, including surfaces of complex curvature. This advantage results from the fact that the effect of the glow discharge in carrying positive ions to the substrate is essentially omnidirectional. Thus, as seen in FIG. 5, the apparatus of FIG. 1 can be used to carry out the method to implant metal or metalloid ions from source electrode 12 in the exposed spherical surface of the male ball joint member 11c, the ball joint member in this case being connected to support 11b of the cathode.

Figure 6:
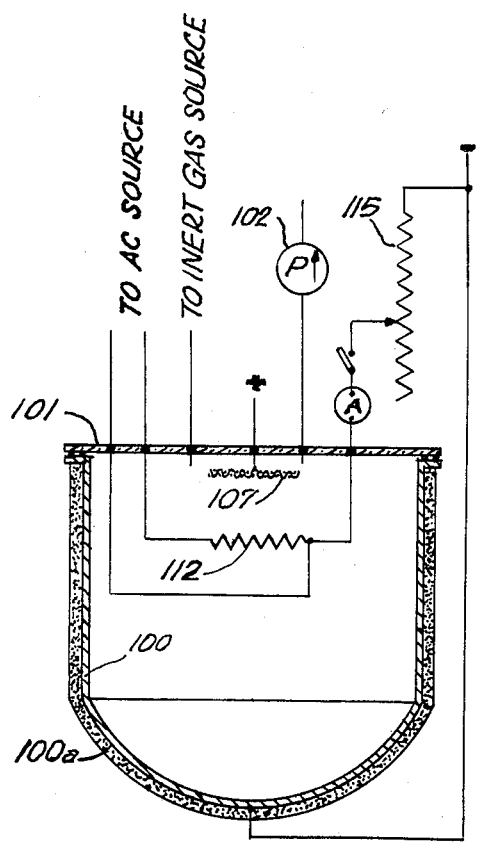
FIG. 6 is a view similar to FIG. 1 of an apparatus embodiment in which a large generally concave surface is to be alloyed.

FIG. 6 illustrates the manner in which the invention can be employed to introduce metal or metalloid ions in the internal surface of a hollow member, e.g., the body of a metal reaction chamber. Here, the hollow metal body 100 forms both a major portion of the wall of the vacuum chamber and the substrate cathode of the system. The chamber is closed by a transparent electrically non-conductive cover member 101, a proper seal being provided between the upper face of the flange body 100 and the cover member. To minimize heat loss via the wall, body 100 carries an outer sheath 100a of thermal insulation. Constituting the substrate, body 100 is electrically connected directly to the negative terminal of the direct current source. Supported by cover member 101 is an anode 107 which is connected to the positive terminal of the direct current source. Source electrode 112 comprises the metal or metalloid to be introduced and is connected both to the negative terminal of the direct current source, via rheostat 115, and across the alternating current source, for resistance heating of the metal or metalloid to be introduced. The interior of the chamber is again connected to a vacuum pump 102, for evacuation of the chamber, and to a tank of inert gas under pressure (not shown), in the manner hereinbefore described with reference to FIG. 1, for establishment of the necessary inert gas atmosphere. Since the entire body 100 constitutes the cathode, the entire inner surface of that body is bombarded, first with ions of the inert atmosphere under the influence of a single glow discharge, then together with positive metal or metalloid ions ejected from grid 112, in the manner hereinbefore described. Employing the method in this fashion, it is practical to produce a relatively inexpensive reactor body which is highly resistant to corrosion. Thus, body 100 can be of stainless steel and source electrode 112 can carry a body of titanium, so that the method loads the inner surface of body 100 with the titanium so that, though relatively inexpensive stainless steel makes up most of the mass of the body, the fact that the inner surface portion has been alloyed with titanium gives corrosion resistance approaching that attainable when the entire wall is of titanium.

What is claimed is:

1. The method for introducing into an electrically conductive substrate at least one normally solid material selected from the group consisting of metals and metalloids, the method producing an alloy of the at least one normally solid material penetrating below the surface of the substrate, the method comprising the steps of:

providing a closed chamber in which the atmosphere and pressure can be controlled and which includes an anode;

positioning the substrate as a cathode with the surface of the substrate exposed to the interior of the chamber and spaced from the anode;

providing a source electrode comprising a body of the material to be introduced into the substrate, said body being exposed within the chamber in a location spaced from the anode and the substrate;

evacuating the chamber and establishing therein an atmosphere of inert gas at a pressure not exceeding 10 torr;

establishing a direct current potential difference between the anode and the cathode and a direct current potential difference between the anode and the source electrode to cause a double glow discharge with one glow discharge occurring between the anode and cathode and the other between the anode and the source electrode and maintaining the double glow discharge for a time period of at least 15 minutes; and maintaining the surface portion of the substrate at an elevated temperature not exceeding the deformation point of the substrate and maintaining said body of material at a temperature equal to at least 40% of the melting point of the material but below the boiling point of the material, said temperatures being maintained throughout said time period;

the double glow discharge causing said body of material to be bombarded by ions of the inert gas of the atmosphere with resultant heating of said body and ejection of positive ions of the material of said body from said body, the positive ions so ejected travelling to the substrate and vigorously bombarding the exposed surface of the substrate as a result of the difference in charge between the positive ions and the substrate, such bombardment causing the metal ions to penetrate the exposed surface of the substrate and permeate a portion of the heated substrate below said surface to thereby form said alloy penetrating below the surface of said substrate.

2. The method defined in claim 2, wherein the substrate surface is metallic and the portion of the substrate to be permeated by ions of the material being introduced is maintained at a temperature of at least 300° C.

3. The method defined in claim 2, wherein
   the substrate is a ferrous metal and the material being introduced into the substrate is an alloy element; and
   the surface portion of the substrate is maintained at 750°–1200° C.

4. The method defined in claim 3, wherein
   the material to be introduced into the substrate is a high melting point metal.

5. The method defined in claim 4, wherein
   the high melting point metal is maintained at white-hot temperature.

6. The method defined in claim 4, wherein
   the source electrode consists of a body of the high melting point metal.

7. The method defined in claim 4, wherein
   the high melting point is tungsten and is maintained at a temperature of 1600°–2800° C.

8. The method defined in claim 4, wherein
   the high melting point metal is molybdenum and is maintained at a temperature of 1200°–2200° C.

9. The method defined in claim 4, wherein
   the high melting point metal is nickel and is maintained at 700°–1300° C.

10. The method defined in claim 4, wherein
    the high melting point metal is chromium and is maintained at 800°–1600° C.

11. The method defined in claim 1, wherein
    the high melting point metal is titanium and is maintained at at least the white-hot temperature.

12. The method defined in claim 1, wherein
    said body is in the form of solid particles.

13. The method defined in claim 12, wherein
    said body comprises particles of more than one material, the particles being uniformly mixed.

14. The method defined in claim 1, wherein
    the material to be introduced into the substrate is a low melting point metal;
    the source electrode includes a support for that metal when the metal is molten; and
    the metal to be introduced into the substrate is maintained in its molten condition throughout the period during which the double glow discharge is maintained.

15. The method defined in claim 1, wherein
    the elevated temperature of the material to be introduced into the substrate is maintained by electrical resistance heating of said body.

16. The method defined in claim 1 and further comprising first establishing the inert gas atmosphere at a pressure less than 1 torr and, while maintaining approximately that pressure, applying between the anode and cathode a direct current potential difference such that a single glow discharge occurs between the anode and cathode;

continuing that potential difference for at least 1 minute; and then establishing the direct current potential difference between the anode and the source electrode and increasing the potential difference between the anode and the cathode to establish the double glow discharge.

17. The method defined in claim 16, wherein
the single glow discharge is allowed to persist only until no significant arc discharges are observed.

18. The method defined in claim 1, wherein
the surface of the substrate exposed to the interior of the chamber is a curved surface.

19. The method defined in claim 18, wherein
the substrate constitutes a portion of the wall of the closed chamber and the curved surface constitutes a portion of the inner surface of the chamber.

20. The method defined in claim 19 and further comprising
providing thermal insulation about the external surface of the substrate to minimize loss of heat from the substrate.

21. The method defined in claim 1 and further comprising
providing a second source electrode comprising a second body of material to be introduced into the substrate,
said second body being exposed within the chamber in a second location spaced from the anode and the substrate;
concurrently with said double glow discharge, establishing a direct current potential difference between the anode and the second source electrode of the same polarity as the potential difference between the anode and cathode,
whereby an additional glow discharge is established between the anode and the second source electrode; and
maintaining said second body at a temperature equal to at least 40% of the melting point of the material of that body but below the boiling point thereof.

22. The method defined in claim 2, wherein
the surface portion of the substrate is initially maintained at a temperature substantially above 300° C. and, during said time period, is progressively cooled to a lower temperature still in excess of 300° C.

23. The method defined in claim 2 and further comprising
cooling the substrate surface portion to a temperature significantly below 300° C. after said time period is completed; and
then continuing the double glow discharge to cause additional positive ions to be ejected from said body and resulting in plating of the substrate surface.

24. The method defined in claim 1, wherein
said body comprises at least one metal selected from the group consisting of aluminum, chromium, molybdenum, niobium, tantalum, tungsten, vanadium and zirconium;
the method further comprising replacing the inert gas atmosphere in the chamber with an ion nitriding atmosphere after completion of said time period; and carrying out ion nitriding of the substrate.

25. In an apparatus for introducing into an electrically conductive substrate at least one normally solid material selected from the group consisting of metals and metalloids, the combination of
means defining a sealed chamber;
means for evacuating the chamber;
means for establishing in the evacuated chamber an inert gas atmosphere at a pressure of 0.1–10 torr;
an anode exposed to the interior of the chamber, the substrate being arranged as a cathode with the surface of the substrate exposed to the interior of the chamber and spaced from the anode;
a source electrode comprising a body of the material to be introduced into the substrate,
said body being disposed in the chamber in a location spaced from the anode and the substrate;
means for establishing between the anode and the substrate a first direct current potential difference in excess of the glow discharge inception voltage for the inert atmosphere and pressure;
means for establishing between the anode and the source electrode a second direct current potential difference of the same polarity as but lower than the first potential difference, whereby glow discharge operation in the abnormal range will result in a first glow discharge between the anode and the cathode and a second glow discharge between the anode and the source electrode; and
means external to the chamber for heating said body,
whereby an alloy of the at least one normally solid material penetrating below the surface of the substrate is created,
whereby the double glow discharge causes said body of material to be bombarded by ions of the inert gas of the atmosphere with resultant heating of said body and ejection of positive ions of the material of said body from said body,
whereby the positive ions so ejected travelling to the substrate and vigorously bombard the exposed surface of the substrate as a result of the difference in charge between the positive ions and the substrate, and whereby such bombardment causes the metal ions to penetrate the exposed surface of the substrate and permeate a portion of the heated substrate below said surface to thereby form said alloy penetrating below the surface of said substrate.

26. The combination defined in claim 25, wherein
said last-mentioned means comprises an alternating current source and means for passing current from that source through said body to accomplish resistance heating of the material to be introduced into the substrate.

27. The combination defined in claim 25, wherein
the substrate comprises a hollow member having a curved inner surface, the hollow member being arranged to form a portion of the wall of the chamber.

28. The combination defined in claim 25 and further comprising
at least a second source electrode comprising a second body of a material to be introduced into the substrate, said second body being disposed in the chamber in a location spaced from the anode and the substrate;

means external to the chamber for heating said second body; and means for establishing between the anode and the second source electrode a third direct current potential difference of the same polarity as but lower than the first potential difference.

* * * * *